US006747261B1

(12) United States Patent
Hsieh et al.

(10) Patent No.: US 6,747,261 B1
(45) Date of Patent: Jun. 8, 2004

(54) IMAGE SENSOR HAVING SHORTENED WIRES

(75) Inventors: Jackson Hsieh, Hsinchu Hsien (TW); Jichen Wu, Hsinchu Hsien (TW); Bruce Chen, Hsinchu Hsien (TW); Jack Chuang, Hsinchu Hsien (TW)

(73) Assignee: Kingpak Technology Inc., Hsinchu Hsien (TW)

(*) Notice: Subject to any disclaimer, the term of this patent is extended or adjusted under 35 U.S.C. 154(b) by 0 days.

(21) Appl. No.: 10/340,333

(22) Filed: Jan. 9, 2003

(51) Int. Cl.[7] .......................... H01L 23/48; H01L 27/00

(52) U.S. Cl. ..................... 250/208.1; 250/239; 257/692

(58) Field of Search .............................. 250/208.1, 216, 250/239; 257/433, 434, 666, 668, 678, 680, 692, 693, 696; 438/64, 126

(56) References Cited

U.S. PATENT DOCUMENTS 3,622,419 A * 11/1971 London et al. ............... 438/64
5,122,861 A * 6/1992 Tamura et al. .............. 257/434
6,649,834 B1 * 11/2003 Hsieh et al. ............... 174/52.4

* cited by examiner

*Primary Examiner*—Kevin Pyo
(74) *Attorney, Agent, or Firm*—Pro-TECHTOR INTERNATIONAL SERVICES

(57) ABSTRACT

An image sensor having shortened wires. The image sensor includes a substrate composed of metal sheets arranged in a matrix, a photosensitive chip, bonding pads on the chip, a frame layer, wires and a transparent layer placed on the frame layer. Each metal sheet has a first board and a second board. A chamber is defined under the substrate to accommodate the chip. Each pad is arranged between first boards. The frame layer is formed on a periphery and the bottom surface to encapsulate the chip. The bottom faces of the second boards are electrically connected to a printed circuit board. Each wire has a first terminal and a second terminal. The first terminals are electrically connected to the pads, and the second terminals are electrically connected to the first boards, respectively.

5 Claims, 2 Drawing Sheets

58 42 44 62 46 60 50 52 48

IMAGE SENSOR HAVING SHORTENED WIRES

BACKGROUND OF THE INVENTION

1. Field of the Invention

The invention relates to an image sensor, and in particular to a package structure of an image sensor having shortened wires.

2. Description of the Related Art

Referring to FIG. 1, a conventional image sensor includes a substrate 10, a frame layer 18, a photosensitive chip 26, a plurality of wires 28, and a transparent layer 34. The substrate 10 has a first surface 12 on which signal input terminals 15 are formed, and a second surface 14 on which signal output terminals 16 are formed. The frame layer 18 has an upper surface 20 and a lower surface 22 adhered to the first surface 12 of the lower surface 22 to form a cavity 24 together with the substrate 10. The photosensitive chip 26 is placed within the cavity 24 formed by the substrate 10 and the frame layer 18 and is mounted to the first surface 12 of the substrate 10. Each of the wires 28 has a first terminal 30 electrically connected to the photosensitive chip 26, and a second terminal 32 electrically connected to a corresponding signal input terminal 15 of the substrate 10. The transparent layer 34 is placed on the upper surface 20 of the frame layer 18.

According to the above-mentioned wire bonding structure, the lengths of the wires 28 from the bonding pads of the photosensitive chip 26 to the signal input terminals 15 of the substrate 10 are quite long. Therefore, the signal transmission speed is slow and the image sensor is impractical.

Referring to FIG. 2, which is a cross-sectional view showing an image sensor disclosed in a U.S. patent application Ser. No. 10/146,997, filed on May 15, 2002. The lengths of the wires 88 are also long, and the signal transmission speed of the image sensor is slow and the signal transmission efficiency thereof is also low.

SUMMARY OF THE INVENTION

An object of the invention is to provide a practical image sensor with shortened wires so as to enhance the signal transmission efficiency.

To achieve the above-mentioned object, the invention provides an image sensor having shortened wires. The image sensor includes a substrate composed of a plurality of metal sheets arranged in a matrix, a photosensitive chip, a plurality of bonding pads, a frame layer, a plurality of wires and a transparent layer. Each of the metal sheets has a first board and a second board located at a height different from that of the first board. A chamber is defined under a bottom surface of the substrate. The photosensitive chip is arranged within the chamber. The bonding pads are formed on the photosensitive chip at positions corresponding to the first boards of the substrate. The bonding pads and the first boards of the substrate are staggered so that each of the bonding pads is arranged between adjacent two of the first boards. The frame layer is formed on a periphery and the bottom surface of the substrate to encapsulate the photosensitive chip. Upper faces of the first boards and bottom faces of the second boards are exposed out of the frame layer, and the bottom faces of the second boards are electrically connected to the printed circuit board. Each of the wires has a first terminal and a second terminal. The first terminals are electrically connected to the bonding-pads of the photosensitive chip, respectively, and the second terminals are electrically connected to the corresponding staggered first boards of the substrate, respectively. The transparent layer is placed on the frame layer to cover the photosensitive chip so that the photosensitive chip may receive optical signals passing through the transparent layer.

Accordingly, the signal transmission distance can be shortened, and the signal transmission speed may be increased.

DETAILED DESCRIPTION OF THE INVENTION

Figure 1:
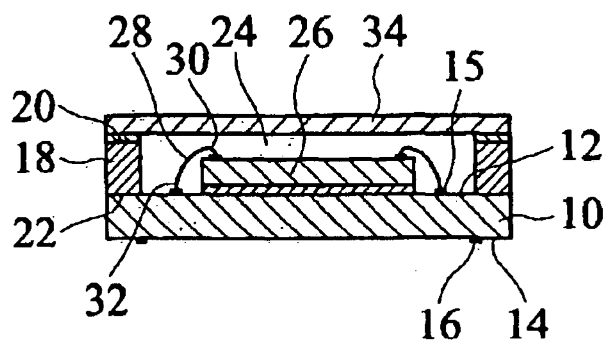
FIG. 1 is a cross-sectional view showing a conventional image sensor.
Figure 2:
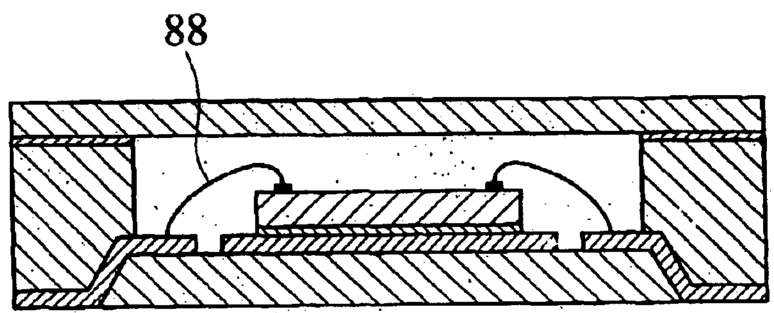
FIG. 2 is a cross-sectional view showing an image sensor disclosed in a U.S. patent application Ser. No. 10/146,997, filed on May 15, 2002.
Figure 3:
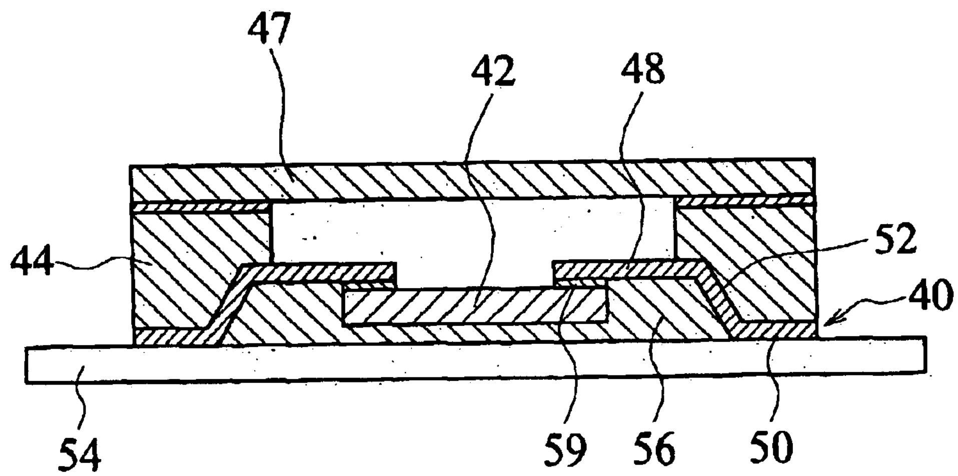
FIG. 3 is a cross-sectional view showing an image sensor having shortened wires of the invention.

Referring to FIG. 3, an image sensor having shortened wires of the invention includes a substrate 40, a photosensitive chip 42, a frame layer 44, a plurality of wires 46 and a transparent layer 47.

The substrate 40 is composed of a plurality of metal sheets arranged in a matrix. Each of the metal sheets includes a first board 48, a second board 50, and a third board 52 connecting the first board 48 to the second board 50 located at a height different from that of the first board 48. A bottom surface of the second board 50 is electrically connected to a printed circuit board 54 to which signals may be transferred. A chamber 56 is formed by the metal sheets on the bottom surface of the substrate 40. The metal sheets of the invention is formed to include the first boards 48, second boards 50, third boards 52 and chamber 56 by way of die pressing. Therefore, the metal sheets may be easily manufactured.

Figure 4:
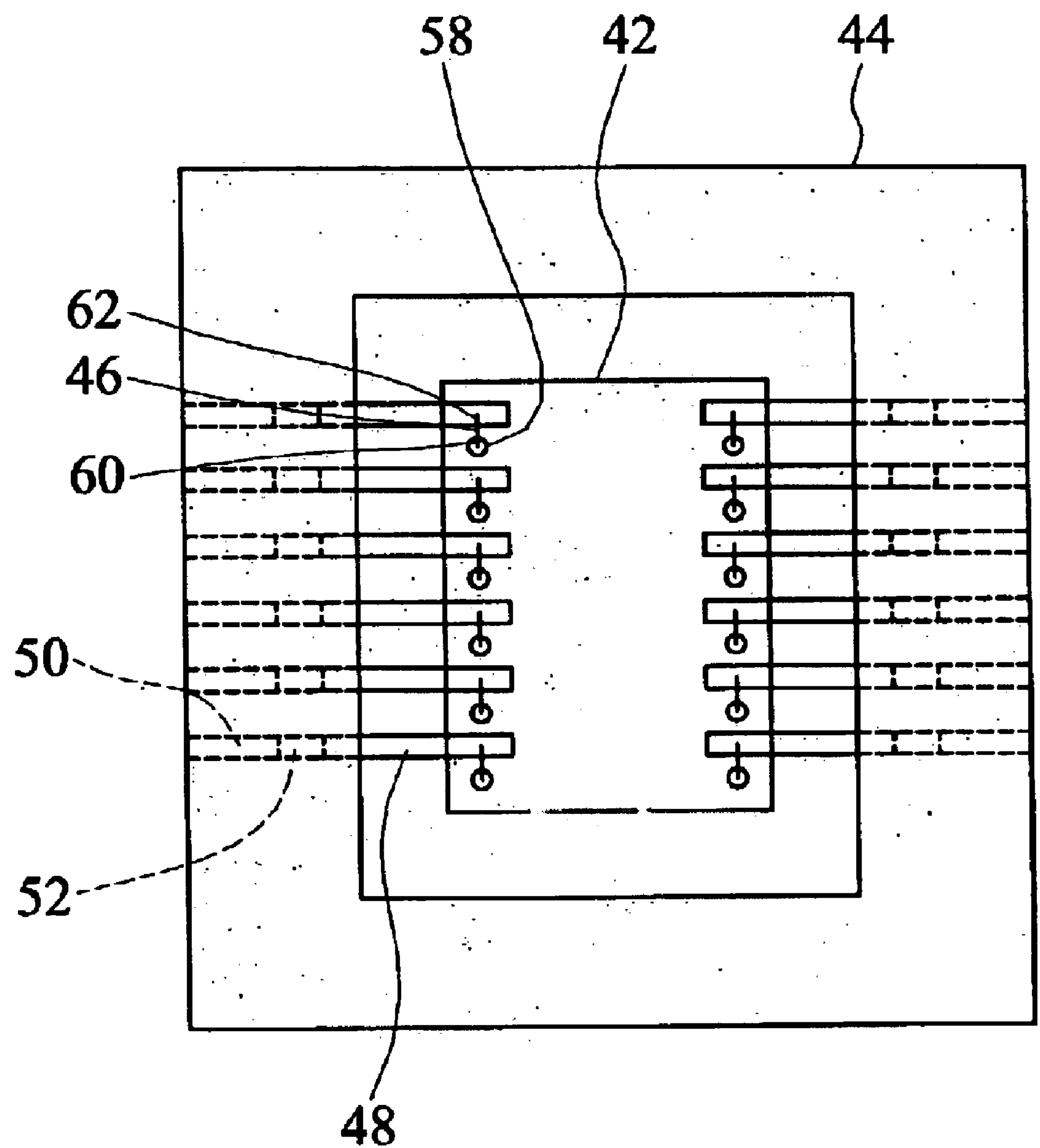
FIG. 4 is a top view showing the image sensor having shortened wires of the invention with the transparent layer removed.

Please refer to FIG. 3 and FIG. 4, which is a top view showing the image sensor having shortened wires of the invention with the transparent layer 47 removed. The photosensitive chip 42 is placed within the chamber of the substrate and is adhered to the bottom surface of the first board 48 of the substrate 40 by the adhesive layer 59. A plurality of bonding pads 58 is formed on the photosensitive chip 42 at positions corresponding to the first boards 48 of the substrate 40. The bonding pads 58 and the first boards 48 are staggered so that each bonding pad 58 is arranged between adjacent two of the first boards 48.

The frame layer 44 is made of thermal plastic material and is formed directly on a periphery and the bottom surface of the substrate 40 to encapsulate the photosensitive chip 42 by way of injection molding. Upper faces of the first boards 48 and bottom faces of the second boards 50 are exposed out of the frame layer 44.

Each of the wires 46 has a first terminal 60 and a second terminal 62, first terminal 60. The first terminals 60 are electrically connected to the bonding pads 58 of the photosensitive chip 42, respectively. The second terminals 62 are electrically connected to the corresponding staggered first boards 48 of the substrate 40, respectively, so that signals from the photosensitive chip 42 may be transferred to the substrate 40 via the wires 46.

The transparent layer 47 is a piece of transparent glass placed on the frame layer 44 to cover the photosensitive chip 42. Then, the photosensitive chip 42 may receive optical signals passing through the transparent layer 47.

According to the above-mentioned structure, because the wires are arranged between two bonding pads 58, the lengths of use wires are shoe Therefore, signal transmission distances from the photosensitive chip 42 to the substrate may be effectively shortened. Furthermore, the material of the wires 46 may be saved, and the signal transmission speed may be increased.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. An image sensor to be electrically connected to a printed circuit board, the image sensor comprising:

a substrate composed of a plurality of metal sheets arranged in a matrix, each of the metal sheets having a first board and a second board located at a height different from that of the first board, and a chamber being defined under a bottom surface of the substrate;

a photosensitive chip arranged within the chamber;

a plurality of bonding pads formed on the photosensitive chip at positions corresponding to the first boards of the substrate, the bonding pads and the first boards of the substrate being staggered so that each of the bonding pads is arranged between adjacent two of the first boards;

a frame layer formed on a periphery and the bottom surface of the substrate to encapsulate the photosensitive chip, upper faces of the first boards and bottom faces of the second boards being exposed out of the frame layer, and the bottom faces of the second boards being electrically connected to the printed circuit board;

a plurality of wires, each of which having a first terminal and a second terminal, the first terminals being electrically connected to the bonding pads of the photosensitive chip, respectively, and the second terminals being electrically connected to the corresponding staggered first boards of the substrate, respectively; and a transparent layer placed on the frame layer to cover the photosensitive chip so that the photosensitive chip may receive optical signals passing through the transparent layer.

2. The image sensor according to claim 1, wherein the photosensitive chip is adhered to the bottom surfaces of the first boards of the substrate by an adhesive layer.

3. The image sensor according to claim 1, wherein the transparent layer is a piece of transparent glass.

4. The image sensor according to claim 1, wherein the frame layer is made of thermal plastic material by way of injection molding.

5. The image sensor according to claim 1, wherein each of the metal sheets further comprises a third board for connecting the first board to the second board.

* * * * *